(12) United States Patent
Chang

(10) Patent No.: US 12,503,373 B2
(45) Date of Patent: Dec. 23, 2025

(54) WAVELENGTH CONVERSION MATERIAL AND MANUFACTURING METHOD THEREOF, WAVELENGTH CONVERSION DEVICE, AND PROJECTION DEVICE

(71) Applicant: Coretronic Corporation, Hsin-Chu (TW)

(72) Inventor: Kuo-Chou Chang, Hsin-Chu (TW)

(73) Assignee: Coretronic Corporation, Hsin-Chu (TW)

(*) Notice: Subject to any disclaimer, the term of this patent is extended or adjusted under 35 U.S.C. 154(b) by 770 days.

(21) Appl. No.: 17/560,292

(22) Filed: Dec. 23, 2021

(65) Prior Publication Data

US 2022/0238764 A1 Jul. 28, 2022

(30) Foreign Application Priority Data

Jan. 22, 2021 (CN) .......................... 202110088378.1

(51) Int. Cl.
| | | |
|---|---|---|
| *C01F 17/30* | (2020.01) | |
| *C09K 11/77* | (2006.01) | |
| *G03B 21/20* | (2006.01) | |
| *H10H 20/851* | (2025.01) | |

(52) U.S. Cl.
CPC .......... *C01F 17/30* (2020.01); *C09K 11/7774* (2013.01); *G03B 21/204* (2013.01); *H10H 20/8512* (2025.01)

(58) Field of Classification Search
CPC .......................... C09K 11/7774; H01L 33/502
See application file for complete search history.

(56) References Cited

U.S. PATENT DOCUMENTS

| | | | |
|---|---|---|---|
| 6,409,938 B1 * | 6/2002 | Comanzo | C09K 11/7774 252/301.4 R |
| 9,738,828 B2 | 8/2017 | Hagemann et al. | |
| 9,952,491 B2 | 4/2018 | Ikesue et al. | |
| 2009/0218585 A1 * | 9/2009 | Zhuang | C09K 11/778 257/E33.061 |
| 2010/0006875 A1 * | 1/2010 | Naum | H01L 33/50 252/586 |
| 2016/0215211 A1 * | 7/2016 | Limburg | H01L 33/504 |
| 2017/0275532 A1 * | 9/2017 | Chang | C09K 11/77348 |

FOREIGN PATENT DOCUMENTS

| | | | |
|---|---|---|---|
| CN | 1480510 | * | 3/2004 |
| CN | 101760197 | | 6/2010 |
| CN | 102076624 | | 5/2011 |
| CN | 10292407 | * | 2/2013 |
| CN | 102924072 | | 2/2013 |
| CN | 102994090 | * | 3/2013 |
| CN | 104177078 | | 2/2016 |
| CN | 104177079 | | 2/2016 |
| CN | 110272279 | | 9/2019 |
| CN | 110325884 | | 10/2019 |
| CN | 110488560 | | 11/2019 |
| TW | I532224 | | 5/2016 |

OTHER PUBLICATIONS

Translation for CN 1480510, Mar. 10, 2004.*
Wang, Lei et al., "Effect of flux on the performance of YAG:Ce3+ phosphor powders", China Ceramic Industry, with English abstract, Jun. 2012, pp. 1-2, vol. 19, No. 3.

* cited by examiner

*Primary Examiner* — C Melissa Koslow
(74) *Attorney, Agent, or Firm* — JCIPRNET (57) ABSTRACT

A wavelength conversion material and a manufacturing method thereof, a wavelength conversion device, and a projection device are provided. The wavelength conversion material has higher phosphor conversion efficiency. The wavelength conversion material includes a first phase. A composition of the first phase is $M_3Al_5(O_{1-0.5x}F_x)_{12}:Ce^{3+}$, where M is at least one selected from a group consisting of yttrium (Y), lutetium (Lu), gadolinium (Gd), terbium (Tb), praseodymium (Pr), and neodymium (Nd), and $0.012 \le x \le 0.3$. The wavelength conversion material with good phosphor conversion efficiency is provided.

19 Claims, 9 Drawing Sheets
(1 of 9 Drawing Sheet(s) Filed in Color)

WAVELENGTH CONVERSION MATERIAL AND MANUFACTURING METHOD THEREOF, WAVELENGTH CONVERSION DEVICE, AND PROJECTION DEVICE

CROSS-REFERENCE TO RELATED APPLICATION

This application claims the priority benefit of China application serial no. 202110088378.1, filed on Jan. 22, 2021. The entirety of the above-mentioned patent application is hereby incorporated by reference herein and made a part of this specification.

BACKGROUND

Technical Field

The disclosure relates to a material and a manufacturing method thereof, and an optical device, and more particularly, to a wavelength conversion material and a manufacturing method thereof, a wavelength conversion device, and a projection device.

Description of Related Art

In recent years, projection devices using solid state light sources such as light-emitting diodes (LEDs) and laser diodes have gradually become popular in the market. Since laser diodes have light emitting efficiency higher than about 20%, to break through the limitation of LED light sources, a technique of using laser light sources to excite phosphor to generate pure color light sources required by projectors has been gradually developed.

In general, the current process of the phosphor wheel is formed by coating a phosphor mixed with silicone on the substrate of the phosphor wheel. However, silicone has issues such as lack of high-temperature resistance and low thermal conduction, and therefore when the laser excites the phosphor wheel over a long period of time, silicone cannot endure the high temperature such that degradation or burning readily occurs. As a result, light emitting efficiency and reliability of the phosphor wheel are affected. On the other hand, another process of the phosphor wheel is formed by replacing silicone with glass frit to mix with a phosphor. The phosphor wheel formed by this process has better thermal conductivity and light transmittance. However, ordinary phosphors have lattice defects of oxygen. Therefore, phosphor conversion efficiency of the phosphor is still insufficient, and the sintering temperature required in the process of the phosphor is relatively high, so that operability is poor.

U.S. Pat. No. 9,738,828 describes that when the composition of the phosphor ceramic is $Y_3Al_5O_{12}$:Ce, $Lu_3(Ga, Al)_5O_{12}$:Ce, or $Mg_3Al_8[SiO]_3$:Ce, the phosphor ceramic has grain boundaries that cause the diffusion of phosphor. U.S. Pat. No. 9,952,491 describes that the composition of the main phase is Ce:$Y_3Al_5O_{12}$, and the composition of the second phase is Ce:$YAlO_3$, $CeO_2$, $Y_2O_3$ or Ce:$Y_2O_3$. China Patent No. 104,177,078 describes $MgAl_2O_4$/$(Ce_xLu_yY_{1-xy})_3Al_5O_{12}$, and the value ranges of x and y are $0.013 \leq x \leq 0.015$ and $0.016 \leq y \leq 0.018$. China Patent No. 104,177,079 describes $MgAl_2O_4$/$(Ce_xSr_yY_{1-xy})_3Al_5O_{12}$, and the value ranges of x and y are respectively $0.001 \leq x \leq 0.03$ and $0.001 \leq y \leq 0.03$.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a wavelength conversion material with higher phosphor conversion efficiency.

The disclosure provides a manufacturing method of a wavelength conversion material, which may provide a wavelength conversion material with higher phosphor conversion efficiency and may reduce a sintering temperature in a step of sintering to have higher operability.

The disclosure provides a wavelength conversion device with higher phosphor conversion efficiency.

The disclosure provides a projection device with higher optical quality.

Other objects and advantages of the disclosure may be further understood from the technical features disclosed herein.

In order to achieve one, a part, or all of the above objectives or other objectives, an embodiment of the disclosure provides a wavelength conversion material. The wavelength conversion material includes a first phase, and a composition of the first phase is $M_3Al_5(O_{1-0.5x}F_x)_{12}$:$Ce^{3+}$, and M is at least one selected from a group consisting of yttrium (Y), lutetium (Lu), gadolinium (Gd), terbium (Tb), praseodymium (Pr), and neodymium (Nd), and $0.012 \leq x \leq 0.3$.

In order to achieve one, a part, or all of the above objectives or other objectives, an embodiment of the disclosure provides a manufacturing method of a wavelength conversion material. The manufacturing method of the wavelength conversion material includes sintering a precursor composition. The precursor composition includes a first metal oxide, a second metal oxide, a fluorine-containing compound, and a cerium-containing compound. The first metal oxide is at least one selected from a group consisting of yttrium oxide, lutetium oxide, gadolinium oxide, terbium oxide, praseodymium oxide, and neodymium oxide. The second metal oxide includes aluminum oxide.

In order to achieve one, a part, or all of the above objectives or other objectives, an embodiment of the disclosure provides a wavelength conversion device. The wavelength conversion device includes a substrate and at least one wavelength conversion layer. The at least one wavelength conversion layer is located on the substrate, and the at least one wavelength conversion layer includes the wavelength conversion material.

In order to achieve one, a part, or all of the above objectives or other objectives, an embodiment of the disclosure provides a projection device. The projection device includes the wavelength conversion device, an excitation light source, a light valve, and a projection lens. The wavelength conversion device has at least one wavelength conversion optical region, and at least one wavelength conversion layer is disposed corresponding to the at least one wavelength conversion optical region. The excitation light source is configured to emit an excitation light beam. The excitation light beam is transmitted to the wavelength conversion device and converted into a conversion beam through the wavelength conversion device. The light valve is located on a transmission path of the conversion beam, and is configured to convert the conversion beam into an image beam. The projection lens is located on a transmission path of the image beam and is configured to convert the image beam into a projection beam.

Based on the above, the embodiments of the disclosure have at least one of the following advantages or effects. In the embodiment of the disclosure, the wavelength conversion material replaces oxygen ions in lattice or fill oxygen vacancies by adding fluorine, so as to reduce lattice defects and increase the phosphor conversion efficiency. In addition, according to the embodiment of the disclosure, the manufacturing method of the wavelength conversion material may also reduce the sintering temperature in the step of sintering by adding the fluorine-containing compound. Therefore, the wavelength conversion device using the wavelength conversion material has higher phosphor conversion efficiency, and the projection device using the wavelength conversion material has higher optical quality.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
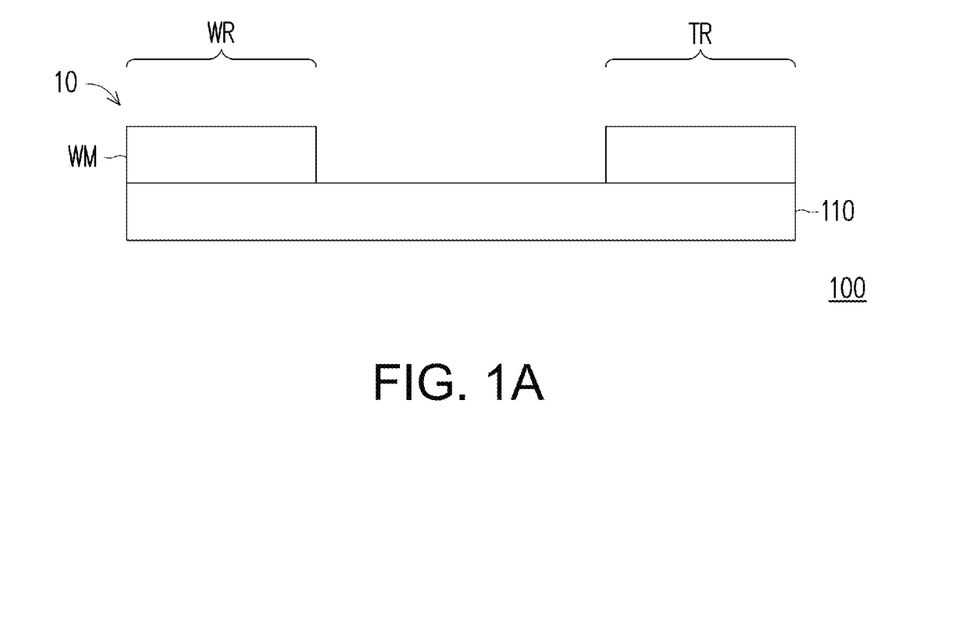
FIG. 1A is a schematic cross-sectional view of a wavelength conversion device according to an embodiment of the disclosure.
Figure 1B:
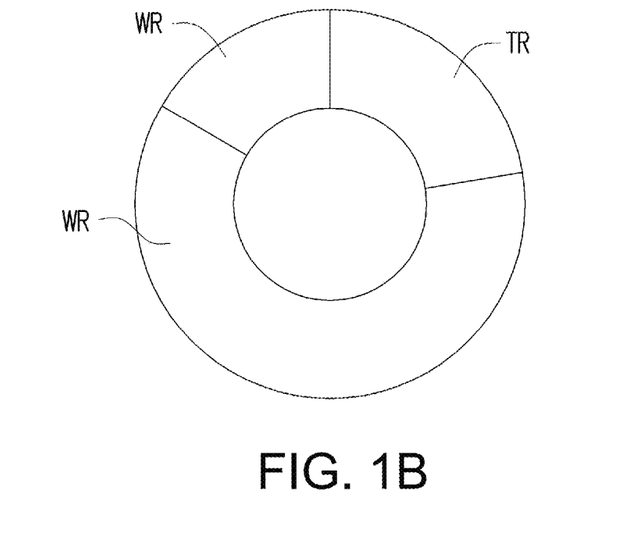
FIG. 1B is a top view of the wavelength conversion device of FIG. 1A.

FIG. 1A is a schematic cross-sectional view of a wavelength conversion device according to an embodiment of the disclosure. FIG. 1B is a top view of the wavelength conversion device of FIG. 1A. Referring to FIGS. 1A and 1B, a wavelength conversion device 100 of this embodiment has at least one wavelength conversion optical region WR and a light passing region TR. The wavelength conversion device 100 includes a substrate 110 and at least one wavelength conversion layer 10. Specifically, as shown in FIG. 1A, in this embodiment, the at least one wavelength conversion layer 10 is located on the substrate 110, and the at least one wavelength conversion layer 10 is disposed corresponding to the at least one wavelength conversion optical region WR. Specifically, as shown in FIG. 1A, in this embodiment, the at least one wavelength conversion layer 10 includes a wavelength conversion material WM, and the at least one wavelength conversion layer 10 is correspondingly disposed on the wavelength conversion optical region WR.

In an embodiment, the wavelength conversion layer 10 includes multiple wavelength conversion optical regions WR, and various wavelength conversion materials are disposed on the wavelength conversion optical regions WR, which may be respectively configured to convert an excitation light beam into multiple conversion beams. The conversion beams are respectively, for example, green, red, and yellow beam.

In this embodiment, the wavelength conversion material WM includes a first phase having a garnet crystal structure. A composition of the first phase is $M_3Al_5(O_{1-0.5x}F_x)_{12}:Ce^{3+}$, and M is at least one selected from a group consisting of yttrium (Y), lutetium (Lu), gadolinium (Gd), terbium (Tb), praseodymium (Pr), and neodymium (Nd), and $0.012 \leq x \leq 0.3$. $(O_{1-0.5x}F_x)_{12}$ represents that oxygen ions and fluorine ions jointly occupy 12 anionic sites in the garnet crystal structure, and x is molar ratio of the fluorine ions present in the garnet crystal structure. The first phase has a fluorine excess.

In general, a reducing atmosphere is often used in a step of sintering of forming the wavelength conversion material WM, which is mainly used to maintain the valence number of a phosphor activating element Ce to be trivalent ($Ce^{3+}$). Therefore, defects of oxygen vacancies are easily formed during the reducing process, which affects phosphor conversion efficiency. In this embodiment, the first phase of the wavelength conversion material WM contains fluorine (i.e., fluoride ions). An ionic radius of fluoride ions is 0.133 nm, which is close to an ionic radius of oxygen ions of 0.140 nm. Therefore, fluoride ions easily replace oxygen ions in the lattice or fill oxygen vacancies, so as to reduce lattice defects and increase the phosphor conversion efficiency. In this way, the fluorine-containing wavelength conversion material WM may enable the wavelength conversion device 100 to have higher phosphor conversion efficiency.

More specifically, in an embodiment, the fluorine-containing wavelength conversion material WM may increase the phosphor conversion efficiency by 5% or more. In another embodiment, the fluorine-containing wavelength conversion material WM may increase the phosphor conversion efficiency by 7% or more.

In an embodiment, the wavelength conversion material WM may further include a second phase. The second phase is mainly composed of aluminum oxide, and may further include $MgAl_2O_4$, $ZnAl_2O_4$, $Al_6Si_2O_{13}$, $NaAlO_2$, or a combination thereof. As the second phase, $MgAl_2O_4$, $ZnAl_2O_4$, $Al_6Si_2O_{13}$, and $NaAlO_2$ may increase a thermal conductivity of the wavelength conversion material WM itself, so as to improve the phosphor conversion efficiency. $MgAl_2O_4$, $ZnAl_2O_4$, $Al_6Si_2O_{13}$, and $NaAlO_2$ are components respectively derived from magnesium oxide, zinc oxide, silicon oxide, and sodium oxide after sintering with aluminum oxide. Magnesium oxide, zinc oxide, silicon oxide and sodium oxide may be used as sintering aids to reduce a sintering temperature in the process. By including $Al_2O_3$ as the second phase, the wavelength conversion material WM may increase the thermal conductivity of the wavelength conversion material WM itself, so as to improve the phosphor conversion efficiency.

In an embodiment, based on a total weight of the wavelength conversion material WM (calculated as 100 wt % (weight percentage)), a content of the second phase is greater than 0 wt % and less than 30 wt %.

In another embodiment, the wavelength conversion layer 10 may further include a bonding material. A material of the bonding material is not particularly limited, which may be selected correspondingly according to the process or product requirements. The material of the bonding material includes glass frit, silicone, or a combination thereof. When the material of the bonding material is glass frit, a thermal conductivity and a light transmittance of the wavelength conversion layer 10 may be improved.

The wavelength conversion material WM is evenly dispersed in the bonding material to form the wavelength conversion layer 10.

Hereinafter, a manufacturing method of the wavelength conversion material WM may be described with FIGS. 2A and 2B. The manufacturing method of the wavelength conversion material WM is not particularly limited. For example, a precursor composition is subjected to an isostatic pressing process or a hot-press sintering process.

Figure 2A:
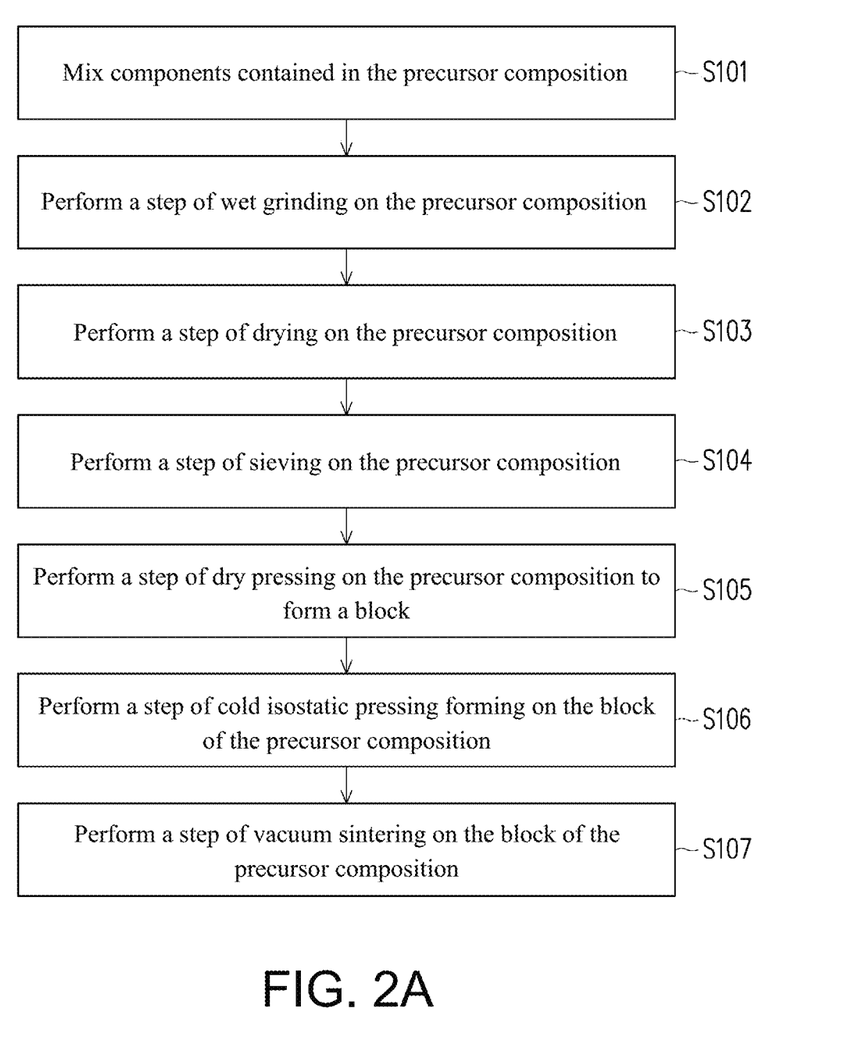
FIG. 2A is a flowchart of an isostatic pressing process of a wavelength conversion material according to an embodiment of the disclosure.

FIG. 2A is a flowchart of an isostatic pressing process of a wavelength conversion material according to an embodiment of the disclosure.

First, in Step S101, components contained in the precursor composition are mixed. The mixing method is not particularly limited. For example, the components contained in the precursor composition are evenly mixed by means of physical mixing.

The precursor composition includes a first metal oxide, a second metal oxide, a fluorine-containing compound, and a cerium-containing compound.

Specifically, in an embodiment, the first metal oxide is at least one selected from a group consisting of yttrium oxide ($Y_2O_3$), lutetium oxide ($Lu_2O_3$), gadolinium oxide ($Gd_2O_3$), terbium oxide ($Tb_2O_3$), praseodymium oxide ($Pr_2O_3$), and neodymium oxide ($Nd_2O_3$).

In an embodiment, based on a total weight of the precursor composition, a content of the first metal oxide is 35 wt % to 55 wt %.

In an embodiment, the second metal oxide includes aluminum oxide. Aluminum oxide may enable the wavelength conversion material WM to generate $Al_2O_3$ of the second phase. In this way, the thermal conductivity of the wavelength conversion material WM itself may be increased to improve the phosphor conversion efficiency.

Hereinafter, reaction formulas of the first metal oxide and the second metal oxide are described in the following. When the first metal oxide is yttrium oxide ($Y_2O_3$), and the second metal oxide is aluminum oxide ($Al_2O_3$), according to an increase in the sintering temperature to be described later, the following three reaction formulas may be included:

Reaction formula 1:

Reaction formula 2:

Reaction formula 3:

In addition, when the precursor composition includes the fluorine-containing compound and the cerium-containing compound, the fluorine-containing compound and the cerium-containing compound may replace the first metal oxide and the second metal oxide to participate in the reaction. Specifically, a fluorine ion in the fluorine-containing compound may replace an oxygen ion, and a cerium ion in the cerium-containing compound may be used as a dopant ion for reaction.

In another embodiment, in addition to aluminum oxide, the second metal oxide further includes magnesium oxide, zinc oxide, silicon oxide, sodium oxide, or a combination thereof. Magnesium oxide, zinc oxide, silicon oxide, and sodium oxide may be used as the sintering aids to reduce the sintering temperature in the process. By including the second metal oxide, the precursor composition may further generate $MgAl_2O_4$, $ZnAl_2O_4$, $Al_6Si_2O_{13}$, and $NaAlO_2$ in the second phase, so as to increase the thermal conductivity of the wavelength conversion material WM itself to improve the phosphor conversion efficiency.

In an embodiment, based on a total weight of the precursor composition, a content of the second metal oxide is greater than 40 wt % and less than 60 wt %.

In an embodiment, the fluorine-containing compound is an alkali metal fluoride, an alkaline earth fluoride, or a combination thereof. In another embodiment, the fluorine-containing compound may be sodium fluoride (NaF), magnesium fluoride ($MgF_2$), or a combination thereof. Note that in this embodiment, by adding the fluorine-containing compound to the precursor composition, the sintering temperature in the subsequent step of sintering may be reduced to have higher operability. For example, the sintering temperature in the subsequent step of sintering is reduced from higher than 1800° C. to about 1700° C., so that the precursor composition may achieve the effect of liquid phase sintering at 1700° C. In more detail, a melting point of the alkali metal fluoride such as sodium fluoride (NaF) is 993° C., and a melting point of the alkaline earth fluoride such as magnesium fluoride ($MgF_2$) is 1260° C., which are much lower than a melting point of yttrium aluminum garnet (YAG) (1950° C.). Therefore, the added alkali metal fluoride and alkaline earth fluoride may be used as the sintering aids in the subsequent step of sintering to reduce the sintering temperature. In an embodiment, based on a total weight of the precursor composition, a content of the fluorine-containing compound is 0.5 wt % to 10 wt % (the weight percentage is 0.5% to 10%).

In an embodiment, the cerium-containing compound is cerium oxide ($CeO_2$), cerium fluoride ($CeF_3$), or a combination thereof. When the cerium-containing compound is cerium fluoride, cerium fluoride may be used as both the cerium-containing compound and the fluorine-containing compound, and exert the effects of the cerium doping and the sintering aid.

In this way, a material included in the precursor composition may be simplified.

In an embodiment, based on a total weight of the precursor composition, a content of the cerium-containing compound is 0.3 wt % to 5 wt %.

Next, in step S102, a step of wet grinding is performed on the precursor composition, so that the precursor composition forms a particle with a particle size of less than 1 micron. The method of wet grinding is not particularly limited. For example, the precursor composition is mixed with a solvent to be ground by mechanical grinding. Specifically, for example, an alumina or zirconia grinding ceramic ball, the precursor composition and the solvent are placed in a jar mill, and a ball mill is used for grinding and mixing. The solvent is not particularly limited, as long as the solvent does not react with the precursor composition. The solvent is, for example, an alcohol solvent such as methanol, ethanol, and isopropanol, etc.

In step S103, a step of drying is performed on the precursor composition. The method of drying is not particularly limited. For example, the precursor composition is placed in an oven for drying. The drying temperature and the drying time are not particularly limited, as long as the solvent used in the step of wet grinding may be volatilized. The drying temperature is, for example, 60 to 80° C. The drying time is, for example, 8 to 16 hours.

In step S104, a step of sieving is performed on the precursor composition. A particle size of the precursor composition after sieving is, for example, 300 mesh or less.

In step S105, a step of dry pressing is performed on the precursor composition to form a block. The method of dry pressing is not particularly limited, as long as the precursor composition may be formed into the block.

In step S106, a step of cold isostatic pressing (CIP) forming is performed on the block of the precursor composition. The method of CIP forming is not particularly limited, as long as a shape of the block may be fixed. The pressure of CIP forming may be 200 MPa or more.

Finally, in step S107, a step of vacuum sintering is performed on the block of the precursor composition. Here, the step of vacuum sintering refers to the step of sintering performed in a vacuum environment. The method of vacuum sintering is not particularly limited, as long as the precursor composition may be formed into the target wavelength conversion material. The vacuum sintering temperature is not particularly limited, which is, for example, higher than 1700° C. The vacuum sintering time is not particularly limited, which is, for example, 2 hours to 48 hours.

Figure 2B:
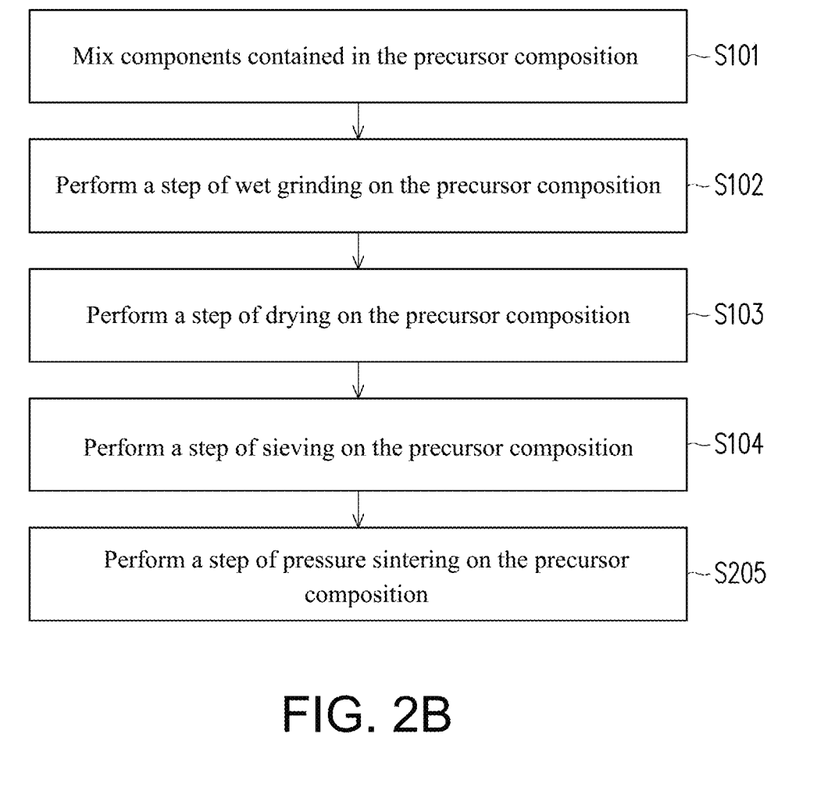
FIG. 2B is a flowchart of a hot-press sintering process of a wavelength conversion material according to another embodiment of the disclosure.

FIG. 2B is a flowchart of a hot-press sintering process of a wavelength conversion material according to another embodiment of the disclosure. Referring to FIG. 2B, the hot-press sintering process of the wavelength conversion material of this embodiment is similar to the isostatic pressing process shown in FIG. 2A. The main difference between the two is that in the hot-press sintering process, after step S104, a step of pressure sintering is performed on the precursor composition in step S205. The method of pressure sintering is not particularly limited, as long as the precursor composition may be formed into the target wavelength conversion material. The pressure of pressure sintering is not particularly limited, which is, for example, 150 MPa to 300 MPa. The pressure sintering temperature is not particularly limited, which is, for example, 1600° C. or higher. The pressure sintering time is not particularly limited, which is, for example, 2 hours to 12 hours. The step of pressure sintering is, for example, performed under a reducing atmosphere. The reducing gas is, for example, a mixed gas of hydrogen and argon or a mixed gas of hydrogen and nitrogen.

The method of the wavelength conversion material WM forming the wavelength conversion layer 10 is not particularly limited, as long as the wavelength conversion material WM may be fixed on the substrate 110. For example, after the wavelength conversion material WM and the bonding material are mixed, the wavelength conversion material WM and the bonding material are cured, and the wavelength conversion material WM is fixed on the substrate 110. In this way, the wavelength conversion layer 10 shown in FIG. 1A may be formed. In this embodiment, the wavelength conversion layer 10 is formed by the wavelength conversion material WM containing fluoride ions, so that the wavelength conversion device 100 may have higher phosphor conversion efficiency.

Figure 3A:
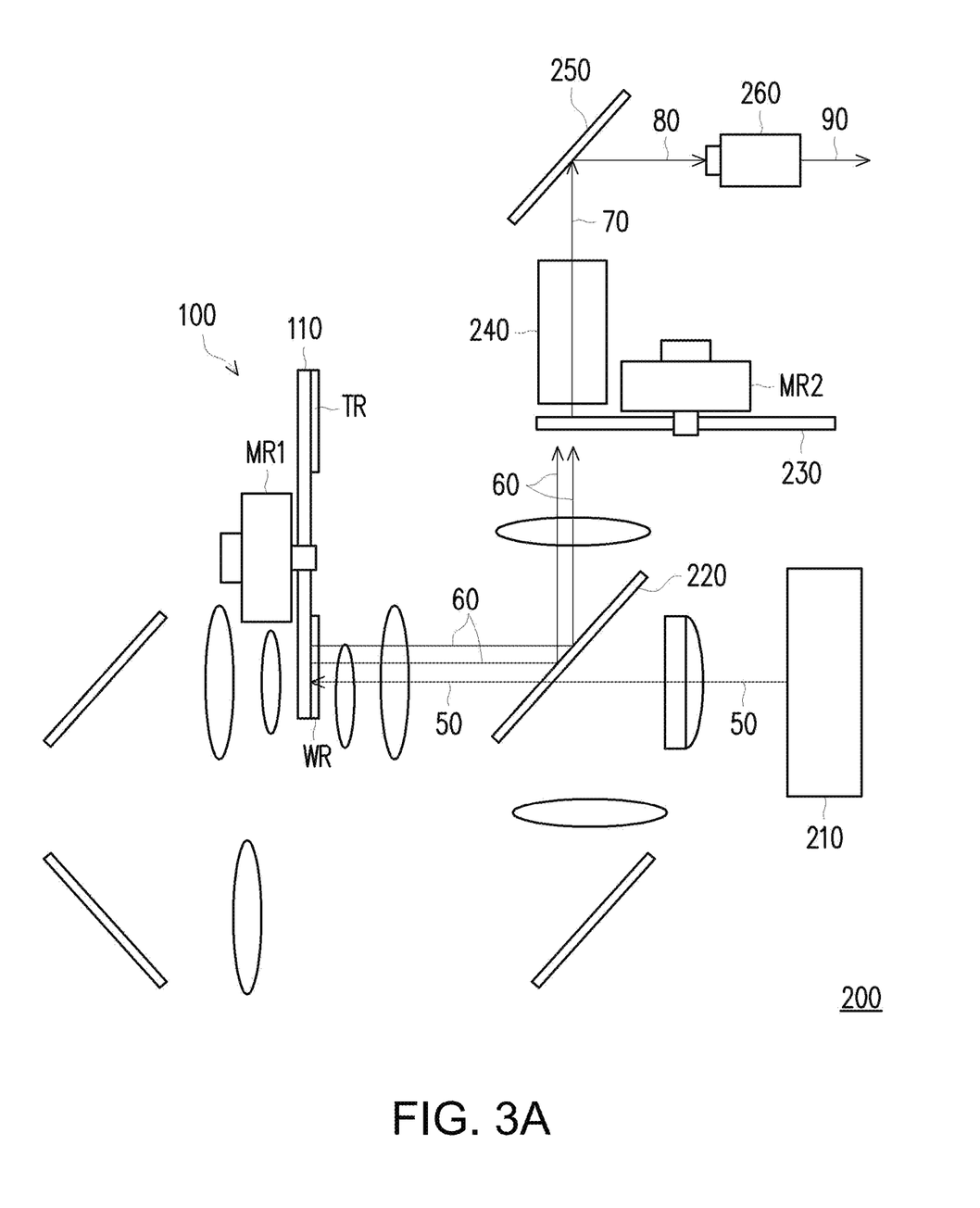
FIG. 3A is a schematic view of an architecture of a projection device when an excitation light beam is converted by a wavelength conversion optical region WR according to an embodiment of the disclosure.
Figure 3B:
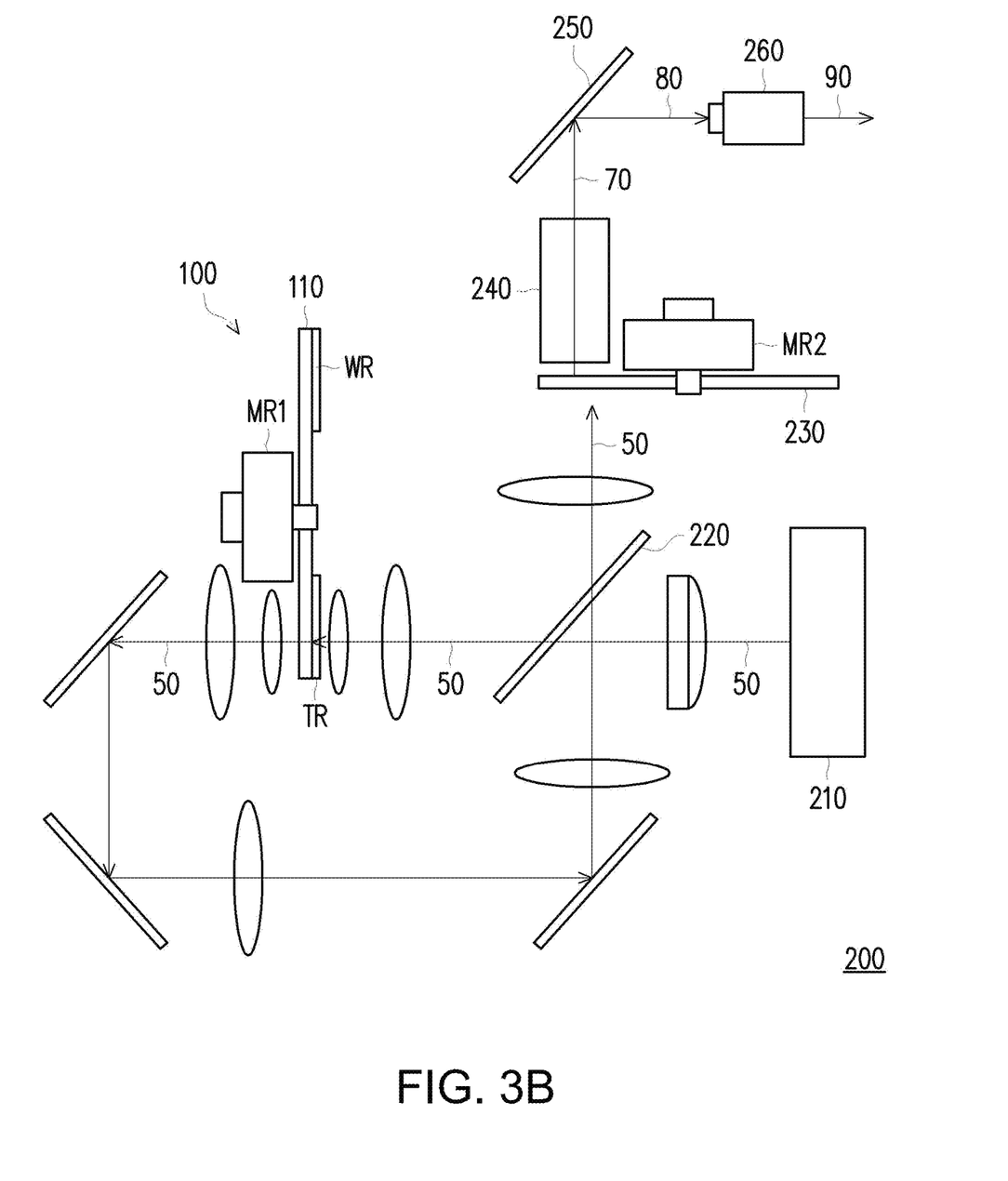
FIG. 3B is a schematic view of an architecture of a projection device when an excitation light beam transmits a light-transmissive region TR according to an embodiment of the disclosure.

FIGS. 3A and 3B are a schematic view of an architecture of a projection device at different times according to an embodiment of the disclosure. Specifically, FIG. 3A is a schematic view of an architecture of a projection device when an excitation light beam is converted by a wavelength conversion optical region WR according to the embodiment of the disclosure, and FIG. 3B is a schematic view of an architecture of a projection device when an excitation light beam transmits a light-transmissive region TR according to the embodiment of the disclosure. Referring to FIGS. 1A, 3A and 3B, a projection device 200 includes an excitation light source 210, a beam splitting unit 220, a wavelength conversion device 100 including a wavelength conversion layer 10, a light valve 250, and a projection lens 260. In this embodiment, structures of the wavelength conversion layer 10 and the wavelength conversion device 100 as shown in FIG. 1A and FIG. 1B have been described in detail above. Therefore, the same details may not be repeated in the following. In this embodiment, the light valve 250 is, for example, a digital micro-mirror device (DMD) or a liquid-crystal-on-silicon panel (LCOS panel). However, in other embodiments, the light valve 250 may also be a transmissive liquid crystal panel or other beam modulators.

As shown in FIGS. 3A and 3B, in this embodiment, the excitation light source 210 is configured to emit an excitation light beam 50. In this embodiment, the excitation light source 210 is a laser light source, and the excitation light beam 50 is a blue laser beam. For example, the excitation light source 210 may include multiple blue laser diodes (not shown) arranged in an array, but the disclosure is not limited thereto.

Specifically, as shown in FIGS. 3A and 3B, in this embodiment, the beam splitting unit 220 is disposed on a transmission path of the excitation light beam 50, and is located between the excitation light source 210 and the wavelength conversion device 100. Specifically, the beam splitting unit 220 may be a partially transmissive and partially reflective element, a dichroic element, a polarization splitting element, or various other elements that may split a beam. For example, in this embodiment, the beam splitting unit 220 may allow a blue beam to pass through, while reflecting beams of other colors (such as red, green, yellow, etc.). That is to say, the beam splitting unit 220 may allow the blue excitation light beam 50 to pass through. In this way, the excitation light beam 50 may pass through the beam splitting unit 220 and be incident on the wavelength conversion device 100.

For example, as shown in FIGS. 1A, 1B, 3A and 3B, the wavelength conversion device 100 is located on the transmission path of the excitation light beam 50. In FIGS. 1A, 1B, 3A, the at least one wavelength conversion optical region WR of the wavelength conversion device 100 is configured to convert the excitation light beam 50 into at least one conversion beam 60. In FIGS. 1A, 1B, and 3B, and the light-transmissive region TR of the wavelength conversion device 100 is configured to enable the excitation light beam 50 to pass through and be transmitted to subsequent optical elements. In addition, the wavelength conversion device 100 further includes a first actuator MR1. The first actuator MR1 is configured to enable the light-transmissive region TR and the at least one wavelength conversion optical region WR to enter an irradiation range of the excitation light beam 50 at different times, and selectively enable the excitation light beam 50 to pass through or be converted into the at least one conversion beam 60.

For example, as shown in FIGS. 3A and 3B, the projection device 200 further includes a filter module 230. The filter module 230 is located on transmission paths of the excitation light beam 50 and the conversion beam 60, and the filter module 230 has at least one filter optical region (not shown) and a light passing region (not shown). The filter module 230 further includes a second actuator MR2 configured to enable the at least one filter optical region (not shown) to correspondingly enter an irradiation range of the conversion beam 60 at different times, so as to respectively form a red color light and a green color light. In addition, the light passing region (not shown) may also correspondingly enter the irradiation range of the excitation light beam 50 transmitted to the filter module 230 at different times, so as to form a blue color light. In this way, the excitation light beam 50 and the conversion beam 60 may be converted into various illumination beams 70 with different colors in a time sequence.

In addition, as shown in FIGS. 3A and 3B, in this embodiment, the projection device 200 further includes a light homogenizing element 240 located on a transmission path of the illumination beam 70. In this embodiment, the light homogenizing element 240 includes an integration rod, but the disclosure is not limited thereto. In more detail, as shown in FIGS. 3A and 3B, when the illumination beam 70 is transmitted to the light homogenizing element 240 from the filter module 230, the light homogenizing element 240 may homogenize the illumination beam 70 and transmit the illumination beam 70 to the light valve 250.

As shown in FIGS. 3A and 3B, the light valve 250 is located on the transmission path of the illumination beam 70, and the light valve 250 is configured to convert the illumination beam 70 into an image beam 80. The projection lens 260 is located on a transmission path of the image beam 80, and the projection lens 260 is configured to project the image beam 80 onto a screen (not shown), so as to form a projection beam 90 that forms an image. After the illumination beam 70 is converged on the light valve 250, the light valve 250 sequentially converts the illumination beam 70 into the image beams 80 of different colors, and transmits the image beams 80 of different colors to the projection lens 260. Therefore, the image projected by the image beam 80 that is converted by the light valve 250 may be a colored image.

In this way, the projection device 200 may also have higher optical quality by adopting the wavelength conversion device 100 with higher phosphor conversion efficiency.

Hereinafter, experimental examples of the wavelength conversion material are described in the following. However, the experimental examples described below are not intended to limit the disclosure. After referring to the disclosure, any person skilled in the art may make appropriate changes to its parameters or settings, but they should still fall within the scope of the disclosure.

Experimental Example 1

First, a precursor composition including 48 grams of yttrium oxide ($Y_2O_3$), 1 gram of sodium fluoride (NaF), 52 grams of aluminum oxide ($Al_2O_3$), and 0.5 gram of cerium oxide ($CeO2$) is placed in a jar mill. After adding 200 grams of ethanol solvent and an alumina or zirconia grinding ceramic ball to the jar mill, the jar mill is placed in a ball mill for grinding and mixing. Next, the precursor composition mixed with the solvent is poured out after ground and mixed, with the grinding ceramic ball sieved out, to a beaker or a drying vessel. The beaker or the drying vessel is transferred to an oven and dried for 12 hours at 60 to 80° C. After the powder of the precursor composition which is dried is sieved with a 300-mesh sieve, the precursor composition is dry pressed with a mold to obtain a block. With the cold isostatic pressing (CIP) forming at the pressure of 200 MPa, the block is packed more compactly. Finally, the block is placed in a vacuum sintering furnace and sintered at a sintering temperature of 1700° C. for 10 hours. The wavelength conversion material of experimental example 1 is obtained.

Comparative Example 1

The wavelength conversion material of comparative example 1 is prepared in the same steps as in experimental example 1. The only difference is that the components contained in the precursor composition and the sintering temperature are changed (as shown in Table 1).

TABLE 1

| | | Experimental example 1 | Comparative example 1 |
|---|---|---|---|
| wavelength conversion material | first phase (P1) | $Y_3Al_5(O_{1-0.5x}F_x)_{12}:Ce^{3+}$ (x = 0.05) | $Y_3Al_5O_{12}:Ce^{3+}$ |
| | second phase (P2) | aluminum oxide | aluminum oxide |
| sintering temperature | | 1700° C. | 1800° C. |
| sintering time | | 10 hours | 10 hours |
| brightness | | 933 fcd | 857 fcd |
| phosphor conversion efficiency | | 108.9% | 100% |
| quantum efficiency gain | | 8.9% | 0% |

Figure 4A:
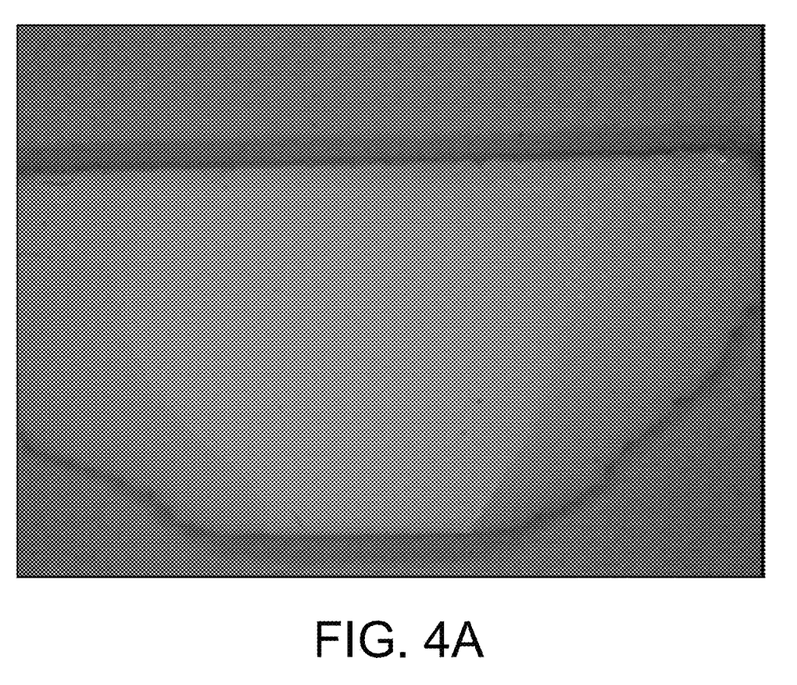
FIG. 4A is an appearance photo of a wavelength conversion material of experimental example 1.
Figure 4B:
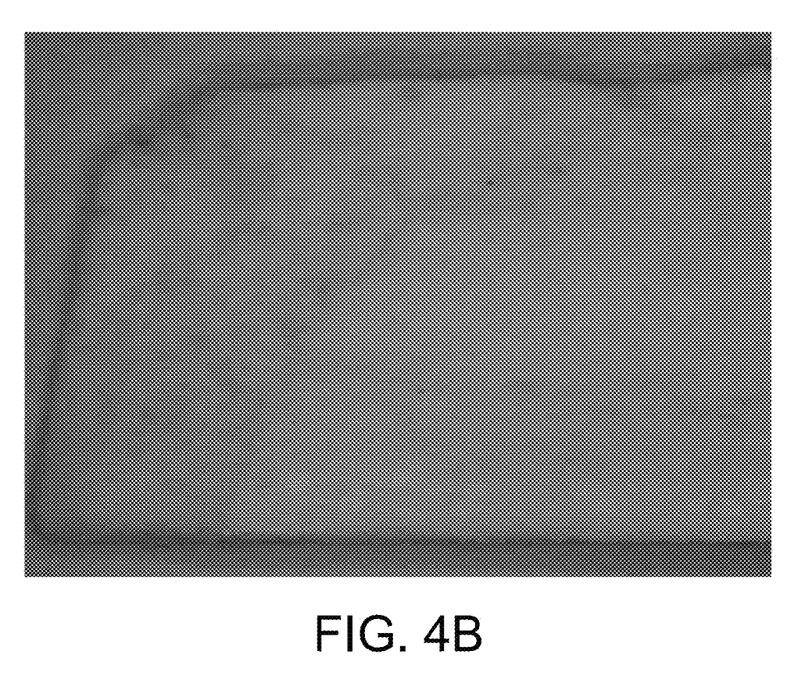
FIG. 4B is an appearance photo of a wavelength conversion material of comparative example 1.

FIGS. 4A and 4B are respectively appearance photos of the wavelength conversion materials taken through a low-magnification microscope in experimental example 1 and comparative example 1. According to FIGS. 4A and 4B, the wavelength conversion materials of experimental example 1 and comparative example 1 are both yellow phosphor ceramics. The yellow phosphor ceramic of experimental example 1 is bright yellow like glass, showing better sintering density and uniformity. A portion of the yellow phosphor region of comparative example 1 is bright yellow like glass. However, most of the region is beige with multiple pores, and ceramic sintering density and uniformity are not good.

Figure 5A:
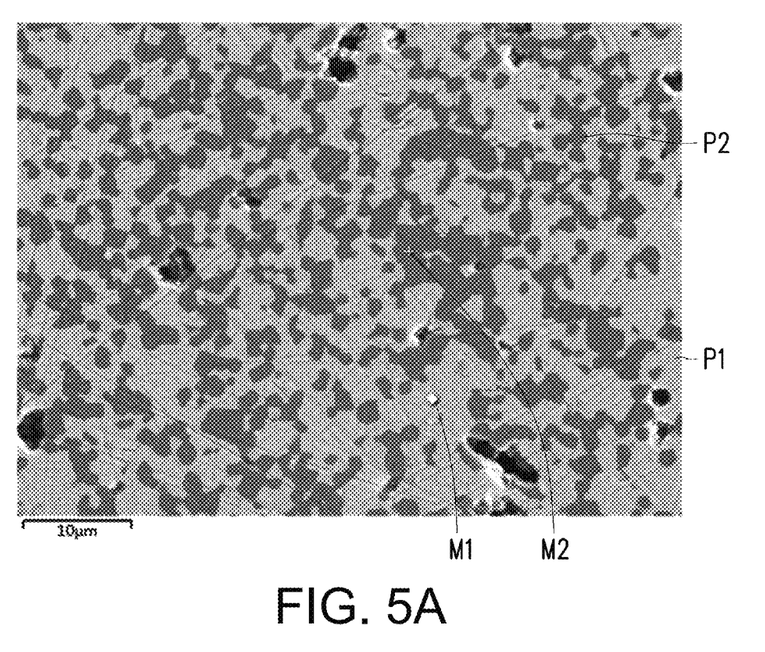
FIG. 5A is a scanning electron microscope (SEM) image of the surface morphology of the wavelength conversion material of experimental example 1.
Figure 5B:
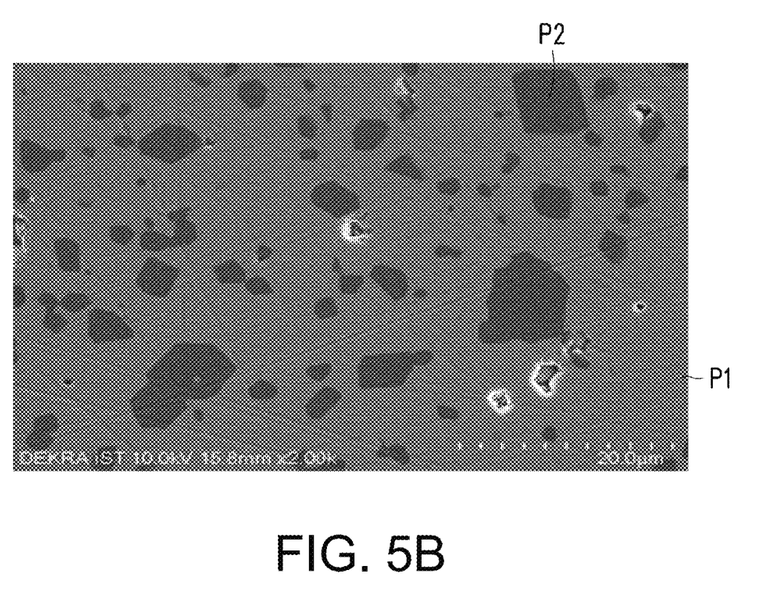
FIG. 5B is a SEM image of the surface morphology of the wavelength conversion material of comparative example 1.

FIGS. 5A and 5B are respectively scanning electron microscope (SEM) images of surface morphologies of the wavelength conversion materials of experimental example 1 and comparative example 1. In FIGS. 5A and 5B, the light color region is a first phase P1, and the dark color region is a second phase P2. As described in Table 1, the first phase P1 of experimental example 1 is $Y_3Al_5(O_{1-0.5x}F_x)_{12}:Ce^{3+}$ (where x=0.05), and the second phase P2 is aluminum oxide. The first phase P1 of comparative example 1 is $Y_3Al_5O_{12}:Ce^{3+}$, and the second phase P2 is aluminum oxide.

Figure 6A:
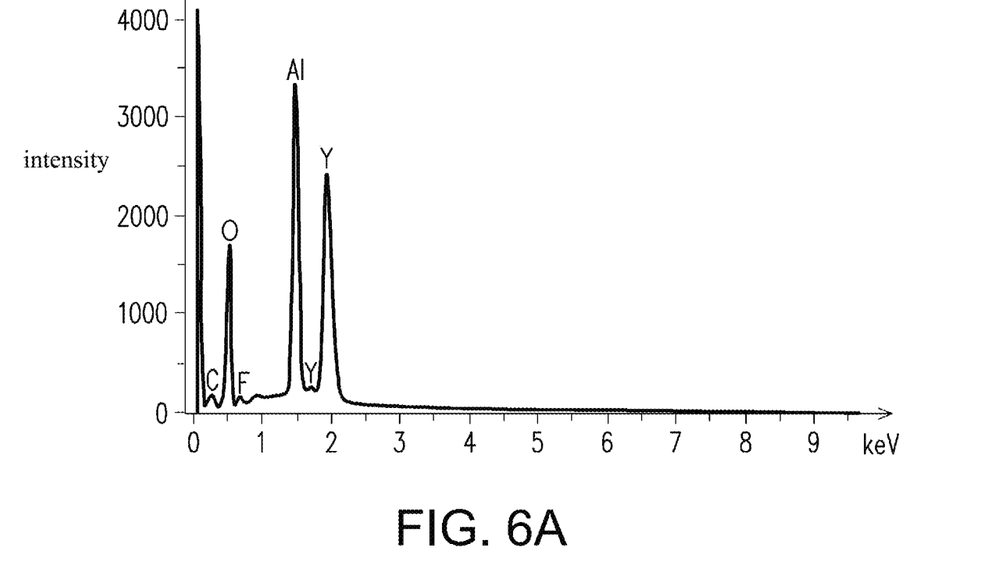
FIG. 6A is an energy dispersive X-ray spectrum of a sampling point M1 in FIG. 5A.
Figure 6B:
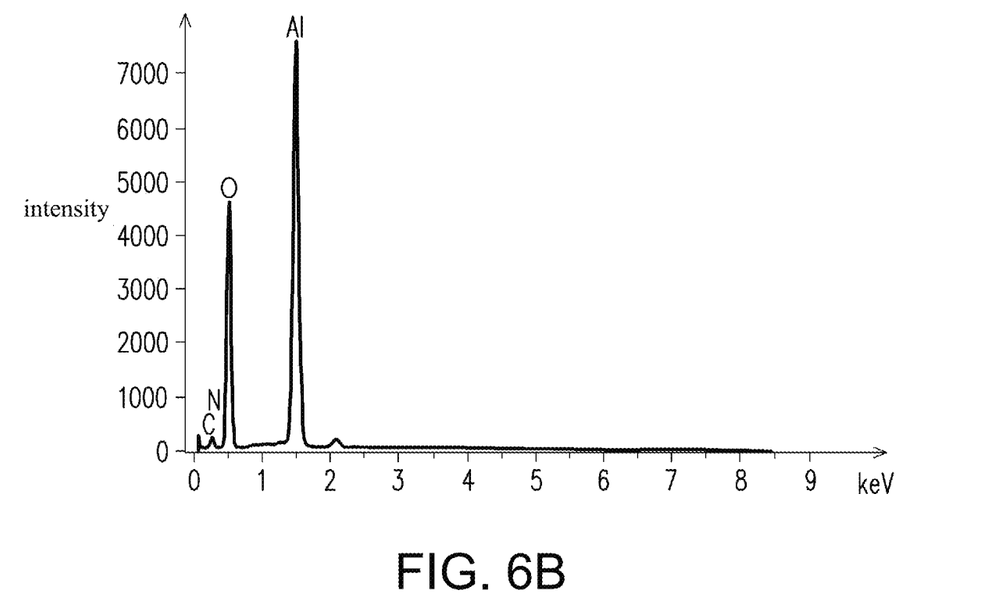
FIG. 6B is an energy dispersive X-ray spectrum of a sampling point M2 in FIG. 5A.

In addition, by an energy dispersive X-Ray detector (hereinafter referred to as "EDX") attached to the SEM, a component analysis is performed on a sampling point M1 and a sampling point M2 in FIG. 5A. The sampling point M1 corresponds to the first phase P1, and the sampling point M2 corresponds to the second phase P2. FIGS. 6A and 6B are respectively energy dispersive X-ray spectra of the sampling point M1 and the sampling point M2 in FIG. 5A. According to FIGS. 6A and 6B, the first phase P1 of experimental example 1 is $Y_3Al_5(O_{1-0.5x}F_x)_{12}:Ce^{3+}$ (where x=0.05), and the second phase P2 is aluminum oxide.

Figure 7:
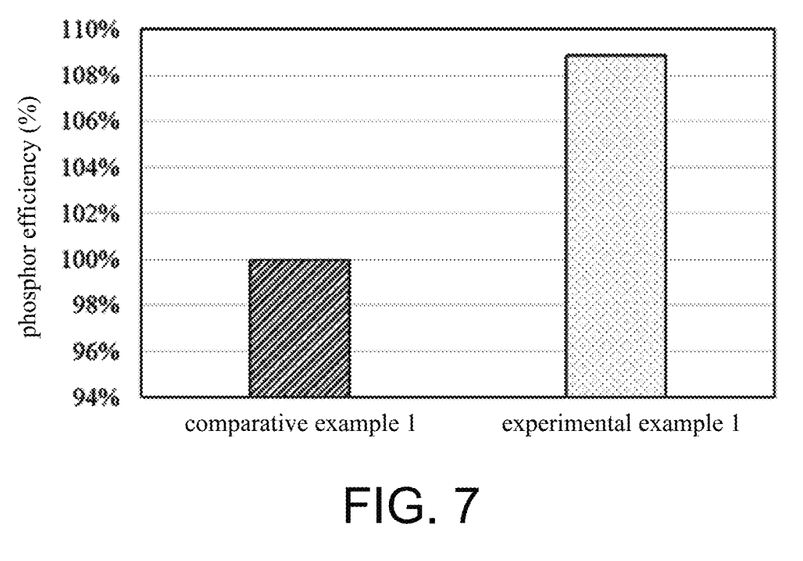
FIG. 7 is a comparison view of phosphor conversion efficiency and quantum efficiency (QE) of the wavelength conversion materials of experimental example 1 and comparative example 1.

The wavelength conversion materials of experimental example 1 and comparative example 1 are directly placed in a projector system for measurement, and the phosphor conversion efficiency and quantum efficiency (QE) gain of the wavelength conversion materials of experimental example 1 and comparative example 1 are analyzed. FIG. 7 is a comparison view of the phosphor conversion efficiency and the QE gain of the wavelength conversion materials of experimental example 1 and comparative example 1. According to FIG. 7, the phosphor conversion efficiency and the QE gain of the wavelength conversion material of experimental example 1 are both higher than those of comparative example 1. From this, it is clear that the fluorine-containing wavelength conversion material of experimental example 1 may improve the phosphor conversion efficiency and increase the quantum efficiency.

Based on the above, the embodiments of the disclosure have at least one of the following advantages or effects. In the embodiment of the disclosure, the wavelength conversion material replaces the oxygen ions in the lattice or fill the oxygen vacancies by adding fluorine, so as to reduce the lattice defects and increase the phosphor conversion efficiency. In addition, according to the embodiment of the disclosure, the manufacturing method of the wavelength conversion material may also reduce the sintering temperature in the step of sintering by adding the fluorine-containing compound. Therefore, the wavelength conversion device using the wavelength conversion material has higher phosphor conversion efficiency, and the projection device using the wavelength conversion material has higher optical quality.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A wavelength conversion material, comprising a first phase,
wherein the first phase has a garnet crystal structure and a composition of the first phase is $M_3Al_5(O_{1-0.5x}F_x)_{12}:Ce^{3+}$, wherein M is at least one selected from a group consisting of yttrium (Y), lutetium (Lu), gadolinium (Gd), terbium (Tb), praseodymium (Pr), and neodymium (Nd), and $0.012 \leq x \leq 0.3$, wherein $(O_{1-0.5x}F_x)_{12}$ represents that oxygen ions and fluorine ions jointly occupy 12 anionic sites in the garnet crystal structure, and x is molar ratio of the fluorine ions present in the garnet crystal structure, wherein the first phase has a fluorine excess.

2. The wavelength conversion material according to claim 1, further comprising a second phase, wherein the second phase comprises $Al_2O_3$ and further comprises $MgAl_2O_4$, $ZnAl_2O_4$, $Al_6Si_2O_{13}$, $NaAlO_2$, or a combination thereof.

3. The wavelength conversion material according to claim 2, wherein, based on a total weight of the wavelength conversion material, a content of the second phase is greater than 0 wt % and less than 30 wt %.

4. A manufacturing method of a wavelength conversion material, comprising:
sintering a precursor composition to form the wavelength conversion material,
wherein the precursor composition comprises a first metal oxide, a second metal oxide, a fluorine-containing compound, and a cerium-containing compound,
the first metal oxide is at least one selected from a group consisting of yttrium oxide, lutetium oxide, gadolinium oxide, terbium oxide, praseodymium oxide, and neodymium oxide, and
the second metal oxide comprises aluminum oxide,
wherein the wavelength conversion material comprises a first phase, the first phase has a garnet crystal structure, and a composition of the first phase is $M_3Al_5(O_{1-0.5x}F_x)_{12}:Ce^{3+}$ wherein M is at least one selected from a group consisting of yttrium (Y), lutetium (Lu), gadolinium (Gd), terbium (Tb), praseodymium (Pr), and neodymium (Nd), and $0.012 \leq x \leq 0.3$, wherein $(O_{1-0.5x}F_x)_{12}$ represents that oxygen ions and fluorine ions jointly occupy 12 anionic sites in the garnet crystal structure, and x is molar ratio of the fluorine ions present in the garnet crystal structure, wherein the first phase has a fluorine excess.

5. The manufacturing method of the wavelength conversion material according to claim 4, wherein based on a total weight of the precursor composition, a content of the fluorine-containing compound is 0.5 wt % to 10 wt %.

6. The manufacturing method of the wavelength conversion material according to claim 4, wherein the second metal oxide further comprises magnesium oxide, zinc oxide, silicon oxide, sodium oxide, or a combination thereof.

7. The manufacturing method of the wavelength conversion material according to claim 4, wherein based on a total weight of the precursor composition, a content of the second metal oxide is greater than 40 wt % and less than 60 wt %.

8. The manufacturing method of the wavelength conversion material according to claim 4, wherein before the sintering, the manufacturing method further comprises:
wet grinding the precursor composition to enable the precursor composition to form a particle with a particle size of less than 1 micron;
drying the precursor composition; and
sieving the precursor composition.

9. The manufacturing method of the wavelength conversion material according to claim 8, wherein after the sieving, the manufacturing method further comprises:
dry pressing the precursor composition to form a block; and
cold isostatic pressing forming the block formed by the precursor composition.

10. The manufacturing method of the wavelength conversion material according to claim 4, wherein the sintering is performed in a vacuum environment.

11. The manufacturing method of the wavelength conversion material according to claim 4, wherein the sintering is pressure sintering.

12. A wavelength conversion device, comprising a substrate and at least one wavelength conversion layer,
wherein the at least one wavelength conversion layer is located on the substrate and comprises a wavelength conversion material, wherein the wavelength conversion material comprises a first phase, and
the first phase has a garnet crystal structure and a composition of the first phase is $M_3Al_5(O_{1-0.5x}F_x)_{12}:Ce^{3+}$, wherein M is at least one selected from a group consisting of yttrium (Y), lutetium (Lu), gadolinium (Gd), terbium (Tb), praseodymium (Pr), and neodymium (Nd), and $0.012 \leq x \leq 0.3$, wherein $(O_{1-0.5x}F_x)_{12}$ represents that oxygen ions and fluorine ions jointly occupy 12 anionic sites in the garnet crystal structure, and x is molar ratio of the fluorine ions present in the garnet crystal structure, wherein the first phase has a fluorine excess.

13. The wavelength conversion device according to claim 12,
wherein the wavelength conversion material further comprises a second phase, and the second phase comprises $Al_2O_3$ and further comprises $MgAl_2O_4$, $ZnAl_2O_4$, $Al_6Si_2O_{13}$, $NaAlO_2$, or a combination thereof.

14. The wavelength conversion device according to claim 13, wherein, based on a total weight of the wavelength conversion material, a content of the second phase is greater than 0 wt % and less than 30 wt %.

15. A projection device, comprising a wavelength conversion device, an excitation light source, a light valve, and a projection lens,
wherein the wavelength conversion device has at least one wavelength conversion optical region, and the wavelength conversion device comprises a substrate and at least one wavelength conversion layer,
wherein the at least one wavelength conversion layer is located on the substrate and is disposed corresponding to the at least one wavelength conversion optical region, wherein the at least one wavelength conversion layer comprises a wavelength conversion material, the wavelength conversion material comprises a first phase, the first phase has a garnet crystal structure, and a composition of the first phase is $M_3Al_5(O_{1-0.5x}F_x)_{12}:Ce^{3+}$, wherein M is at least one selected from a group consisting of yttrium (Y), lutetium (Lu), gadolinium (Gd), terbium (Tb), praseodymium (Pr), and neodymium (Nd), and $0.012 \leq x \leq 0.3$, wherein $(O_{1-0.5x}F_x)_{12}$ represents that oxygen ions and fluorine ions jointly occupy 12 anionic sites in the garnet crystal structure, and x is molar ratio of the fluorine ions present in the garnet crystal structure, wherein the first phase has a fluorine excess, the excitation light source is configured to emit an excitation light beam, wherein the excitation light beam is transmitted to the wavelength conversion device and converted into a conversion beam through the wavelength conversion device, the light valve is located on a transmission path of the conversion beam, and is configured to convert the conversion beam into an image beam, and the projection lens is located on a transmission path of the image beam, and is configured to convert the image beam into a projection beam.

16. The projection device according to claim 15, wherein the wavelength conversion material further comprises a second phase, and the second phase comprises $Al_2O_3$ and further comprises $MgAl_2O_4$, $ZnAl_2O_4$, $Al_6Si_2O_{13}$, $NaAlO_2$, or a combination thereof.

17. The projection device according to claim 16, wherein based on a total weight of the wavelength conversion material, a content of the second phase is greater than 0 wt % and less than 30 wt %.

18. A manufacturing method of a wavelength conversion material, comprising:
   sintering a precursor composition,
   wherein the precursor composition comprises a first metal oxide, a second metal oxide, a fluorine-containing compound, and a cerium-containing compound,
   the first metal oxide is at least one selected from a group consisting of yttrium oxide, lutetium oxide, gadolinium oxide, terbium oxide, praseodymium oxide, and neodymium oxide, and
   the second metal oxide comprises aluminum oxide,
   before the sintering, the manufacturing method further comprises:
   wet grinding the precursor composition to enable the precursor composition to form a particle with a particle size of less than 1 micron;
   drying the precursor composition; and
   sieving the precursor composition.

19. A manufacturing method of a wavelength conversion material, comprising:
   sintering a precursor composition,
   wherein the sintering is pressure sintering,
   the precursor composition comprises a first metal oxide, a second metal oxide, a fluorine-containing compound, and a cerium-containing compound,
   the first metal oxide is at least one selected from a group consisting of yttrium oxide, lutetium oxide, gadolinium oxide, terbium oxide, praseodymium oxide, and neodymium oxide, and
   the second metal oxide comprises aluminum oxide.

* * * * *